(12) United States Patent
Kaanta

(10) Patent No.: US 10,427,931 B2
(45) Date of Patent: Oct. 1, 2019

(54) SELECTIVE CONDUCTIVE COATING FOR MEMS SENSORS

(71) Applicant: Analog Devices, Inc., Norwood, MA (US)

(72) Inventor: Bradley C. Kaanta, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 5 days.

(21) Appl. No.: 15/635,846

(22) Filed: Jun. 28, 2017

(65) Prior Publication Data

US 2017/0369304 A1    Dec. 28, 2017

Related U.S. Application Data

(60) Provisional application No. 62/355,834, filed on Jun. 28, 2016.

(51) Int. Cl.
| | | |
|---|---|---|
| *H01L 21/00* | (2006.01) | |
| *B81B 3/00* | (2006.01) | |
| *B81C 1/00* | (2006.01) | |
| *G01P 15/125* | (2006.01) | |

(52) U.S. Cl.
CPC ........ *B81B 3/0086* (2013.01); *B81C 1/00698* (2013.01); *G01P 15/125* (2013.01); *B81B 2201/0221* (2013.01)

(58) Field of Classification Search
CPC .......... B81B 3/0086; B81B 2201/0221; B81C 1/00698; G01P 15/125
See application file for complete search history.

(56) References Cited

U.S. PATENT DOCUMENTS

| | | |
|---|---|---|
| 5,028,565 A | 7/1991 | Chang et al. |
| 5,077,236 A | 12/1991 | Kim |
| 5,202,287 A | 4/1993 | Joshi et al. |
| 5,376,585 A | 12/1994 | Lin et al. |
| 5,795,824 A | 8/1998 | Hancock |

(Continued)

FOREIGN PATENT DOCUMENTS

| | | | |
|---|---|---|---|
| DE | 10 2011 085084 A1 | 4/2013 | |
| JP | 06029237 A | 2/1994 | |

(Continued)

OTHER PUBLICATIONS

Kavalenka et al., "Hybrid Polymer/Ultrathin Porous Nanocrystalline Silicon Membranes System for Flow-through Chemical Vapor and Gas Detection", Mater. Res. Soc. Symp. Proc. vol. 1190, 2009, pp. 199-204.*

(Continued)

*Primary Examiner* — Richard A Booth
(74) *Attorney, Agent, or Firm* — Wolf, Greenfield & Sacks, P.C.

(57) ABSTRACT

A capacitive microelectromechanical systems (MEMS) sensor is provided, having conductive coatings on opposing surfaces of capacitive structures. The capacitive structures may be formed of silicon, and the conductive coating is formed of tungsten in some embodiments. The structure is formed in some embodiments by first releasing the silicon structures and then selectively coating them in the conductive material. In some embodiments, the coating may result in encapsulating the capacitive structures.

20 Claims, 5 Drawing Sheets

(56) References Cited

U.S. PATENT DOCUMENTS

| | | |
|---|---|---|
| 5,874,360 A | 2/1999 | Wyborn et al. |
| 6,048,792 A | 4/2000 | Watanabe et al. |
| 6,054,172 A | 4/2000 | Robinson et al. |
| 6,274,472 B1 | 8/2001 | Hossain et al. |
| 6,287,964 B1 | 9/2001 | Cho |
| 6,380,083 B1 | 4/2002 | Gross |
| 6,500,760 B1 | 12/2002 | Peterson et al. |
| 6,531,341 B1 | 3/2003 | Peterson et al. |
| 6,946,716 B2 | 9/2005 | Andriacos et al. |
| 6,956,283 B1 | 10/2005 | Peterson |
| 7,094,614 B2 | 8/2006 | Armbrust et al. |
| 7,226,802 B2 | 6/2007 | Ocansey et al. |
| 7,580,172 B2 | 8/2009 | Lewis et al. |
| 7,673,679 B2 | 3/2010 | Harrison et al. |
| 8,300,299 B2 | 10/2012 | Tung et al. |
| 8,399,351 B2 | 3/2013 | Takahashi |
| 9,758,367 B2 | 9/2017 | Kaanta |
| 2002/0141690 A1 | 10/2002 | Jin et al. |
| 2004/0016995 A1 | 1/2004 | Kuo et al. |
| 2004/0227201 A1 | 11/2004 | Borwick et al. |
| 2006/0205106 A1* | 9/2006 | Fukuda ............... B81C 1/00246 438/52 |
| 2007/0013052 A1 | 1/2007 | Zhe et al. |
| 2007/0258123 A1 | 11/2007 | Xu et al. |
| 2008/0093684 A1 | 4/2008 | Inaba et al. |
| 2009/0004848 A1 | 1/2009 | Kim et al. |
| 2009/0246373 A1 | 10/2009 | Tachibana et al. |
| 2013/0099382 A1 | 4/2013 | Reinmuth et al. |
| 2017/0166439 A1 | 6/2017 | Kaanta |

FOREIGN PATENT DOCUMENTS

| | | |
|---|---|---|
| KR | 20010046339 A | 6/2001 |
| WO | WO 2006/127776 A1 | 11/2006 |

OTHER PUBLICATIONS

Kotani et al., A highly reliable selective CVD-W utilizing SiH4 reduction for VLSI contacts.—Abstract. Electron Devices Meeting, International vol. 33, IEEE, pp. 217-220, 1987.

Mani et al., Effect of W Coating on Microengine Performance. Sandia National Laboratories, Albuquerque, NM. 2000; 8 pages.

Mani et al., W-coating for MEMS. Sandia National Laboratories, Albuquerque, NM. 1999; 10 pages.

Orij et al., Modelling of the Deposition of Molybdenum on Silicon from Molybdenum Hexafluoride and Hydrogen. Journal de Physique IV. 1995; 05(C5):C5-331-C5-338.

Pandey et al., Effect of metal coating and residual stress on the resonant frequency of MEMS resonators. *Sādhanā*. Aug. 2009; 34(4):651-61.

Rosler et al., Abstract of—Tungsten chemical vapor deposition characteristics using SiH4 in a single wafer system. Journal of Vacuum Science & Technology. 1988;B6:1721-7.

* cited by examiner

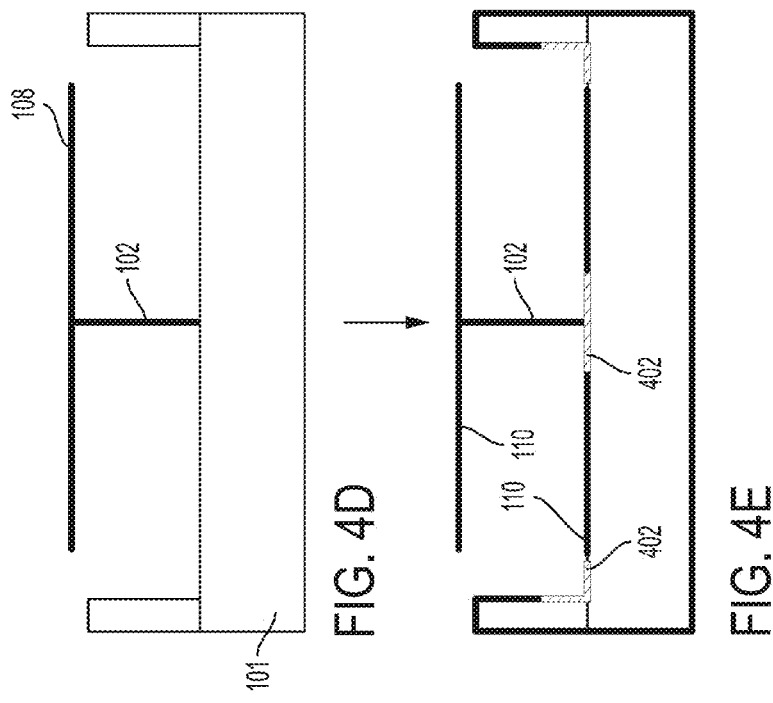
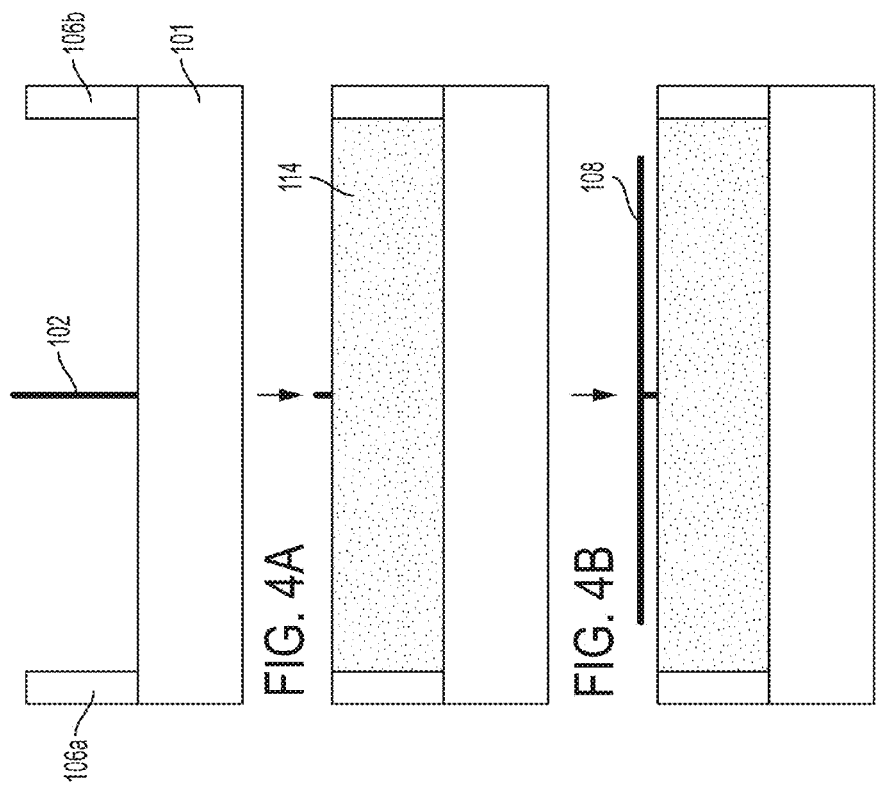

SELECTIVE CONDUCTIVE COATING FOR MEMS SENSORS

RELATED APPLICATIONS

This Application claims priority under 35 U.S.C. § 119(e) to U.S. Provisional Application Ser. No. 62/355,834, filed Jun. 28, 2016, and entitled "SELECTIVE CONDUCTIVE COATING FOR MEMS SENSORS," which is hereby incorporated herein by reference in its entirety.

FIELD

The present application relates to capacitive microelectromechanical systems (MEMS) sensors and to coatings for the same.

BACKGROUND

Capacitive microelectromechanical systems (MEMS) sensors detect a characteristic of interest based on a change in capacitance between two components of the sensor. In some such sensors, the two components are positioned laterally with respect to each other, and a change in the lateral capacitance is monitored. In some other such sensors, the components are positioned vertically with respect to each other, and a change in vertical capacitance is monitored.

SUMMARY

A capacitive microelectromechanical systems (MEMS) sensor is provided, having conductive coatings on opposing surfaces of capacitive structures. The capacitive structures may be formed of silicon, and the conductive coating is formed of tungsten in some embodiments. The structure is formed in some embodiments by first releasing the silicon structures and then selectively coating them in the conductive material. In some embodiments, the coating may result in encapsulating the capacitive structures.

According to an embodiment, a microelectromechanical systems (MEMS) sensor is provided, comprising: a first capacitor plate covered with a metal; a second capacitor plate in-plane with the first capacitor plate in a first plane, spaced apart from the first capacitor plate, and covered with the metal; and a third capacitor plate covered with the metal and spaced apart from the first capacitor plate in a second plane different from the first plane.

According to an embodiment, a method of fabricating a microelectromechanical systems (MEMS) sensor is provided. The MEMS sensor has at least a first capacitor plate with an exterior surface. The method comprises releasing the first capacitor plate from a substrate; and forming a layer of conductive material on the exterior surface of the first capacitor plate subsequent to releasing the capacitor plate from the substrate.

According to an embodiment, a microelectromechanical systems (MEMS) device is provided, comprising: a movable mass having a first electrode with a top, bottom, and side surface all covered by a metal; and a second electrode spaced apart from and facing the side surface of the first electrode, the second electrode being covered by the metal.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 4A-4E illustrate a fabrication sequence of a capacitive MEMS sensor with conductive coatings consistent with the process flow sequence of FIG. 3, according to a non-limiting embodiment.

DETAILED DESCRIPTION

Figure 1:
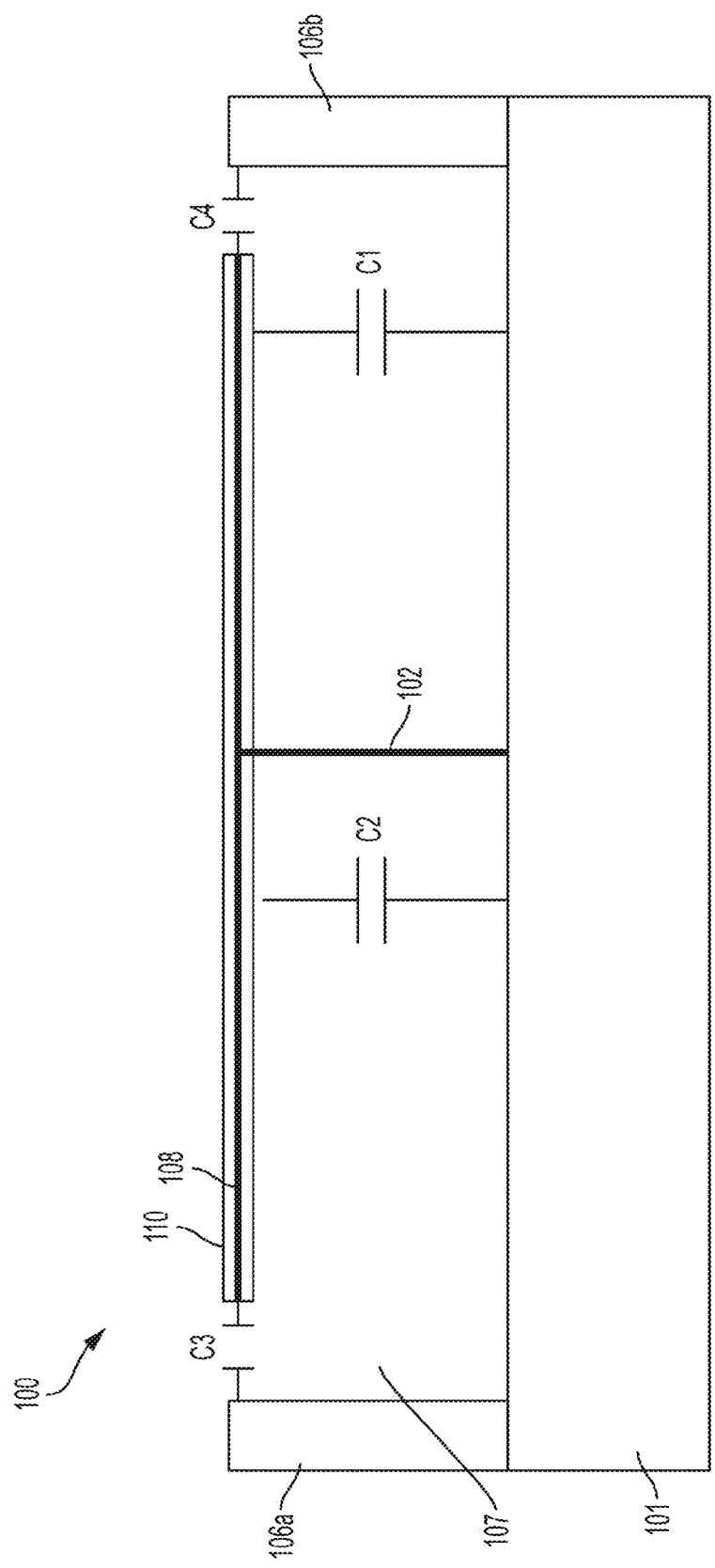
FIG. 1 illustrates a MEMS sensor according to an embodiment of the present application.

Aspects of the present application provide a capacitive microelectromechanical systems (MEMS) sensor having two or more non-contacting, opposing surfaces encapsulated with a conductive material which provides increased surface conductivity, thus reducing or entirely removing the surface charge on the surfaces. Reducing the surface charge in turn may improve the performance of the MEMS sensor by reducing or eliminating entirely any offset signal attributable to undesired surface charge. In some embodiments, the encapsulating material may be tungsten, and may selectively encapsulate silicon surfaces of opposing components of the MEMS sensor. Silicon surfaces may be particularly susceptible to the build-up of surface charge because silicon readily grows a native oxide which is prone to build-up of surface charge. The use of tungsten as a coating (e.g., encapsulating) material reduces or eliminates this problem.

Aspects of the present application provide a method for selectively forming a conductive coating on opposing, non-contacting surfaces of a capacitive MEMS sensor. The capacitive MEMS sensor may include surfaces forming multiple capacitors in different planes, such as a first capacitor in a first (e.g., horizontal) plane and a second capacitor in a second, orthogonal (e.g., vertical) plane. One or more of the surfaces making up the capacitors may be fabricated at least in part through a release step, in which a defined structure is released from a surrounding or underlying material. For example, the MEMS sensor may include a movable mass formed in part by releasing the mass from an underlying substrate. Subsequent to the release, a conductive coating may be selectively formed on surfaces of interest, such as the opposing surfaces of the capacitive structures. By forming (or applying) the conductive coating subsequent to release, rather than forming the conductive coating prior to release of the structures to be coated, encapsulation of the desired structures may be achieved. Encapsulating the structures of interest in the conductive material may provide better performance in terms of reducing surface charge buildup, by ensuring that surfaces which would otherwise be subject to charge build-up are coated.

As described, the conductive coating may be formed selectively in at least some embodiments. Selective formation (e.g., deposition or growth) may be achieved in any suitable manner. For example, in one embodiment the surfaces of the MEMS device to be coated may be formed of silicon, and the coating may be achieved using tungsten hexafluoride. Tungsten hexafluoride may react with silicon to yield tungsten layers, for example by consuming silicon, which allows the selective coating of silicon and not silicon dioxide. Such selective coating may be beneficial for various reasons, including that selective deposition may reduce surface charge on the MEMS sensor without shorting electrical connections by coating dielectric (e.g., oxide, silicon nitride, or other non-conductive materials) layers separating the electrical connections.

As described, aspects of the present application provide for selectively coating, or encapsulating, opposing surfaces of a capacitive MEMS sensor with a conductive material. The conductive material may prevent surface charge build-up (or accumulation) on the opposing surfaces. Additionally, in some embodiments, the encapsulating material may increase the mass of the coated MEMS sensor components. Increased mass of the components in some embodiments will contribute to increased sensitivity of the sensor, such as for inertial sensors.

The aspects and embodiments described above, as well as additional aspects and embodiments, are described further below. These aspects and/or embodiments may be used individually, all together, or in any combination of two or more, as the application is not limited in this respect.

As described above, an aspect of the present application provides a capacitive MEMS sensor having opposing, non-contacting surfaces selectively coated with (e.g., encapsulated in) a conductive coating. FIG. 1 illustrates a non-limiting example of such a capacitive MEMS sensor 100, according to an aspect of the present application. The MEMS sensor 100 includes a substrate 101, an anchor 102, sidewalls 106a and 106b, and a movable body 108 coated with a conductive material 110. The movable body may be disposed in a cavity or well 107. As shown, multiple capacitors may be formed between opposing surfaces, including capacitors C1, C2, C3, and C4. In one embodiment, the MEMS sensor 100 is a capacitive inertial sensor, although alternatives are possible.

The substrate 101 may be any suitable substrate formed of any suitable material. For example, the substrate 101 may be a semiconductor (e.g., silicon) substrate in some embodiments. In some embodiments, the substrate 101 may be a silicon on insulator (SOI) substrate. Alternatives are possible.

The movable body 108 may be any of various types of movable bodies, may be formed of silicon or another suitable material, and may have any suitable shape and dimension. In some embodiments, the movable body is a proof mass, such as a plate, ring, or disc. In other embodiments, the movable body is a beam. The various aspects described herein are not limited to use with any particular form of movable body. The movable body may be configured to move in-plane, out-of-plane (e.g., through rotation) or in a combination of the two.

The movable body 108 may be formed of a semiconductor material, such as silicon. In some embodiments, the movable body 108 is formed of a material having a native oxide. Thus, silicon represents a non-limiting example, as it has a native silicon oxide. Because the movable body 108 may be formed of a material having a native oxide, it may be coated with conductive material 110, which may be considered a coating or layer. The conductive material may be tungsten in some embodiments, and may serve to prevent surface charge build-up (or accumulation) on the surfaces of the movable body 108. Thus, as a non-limiting example, the movable body 108 may be formed of silicon and coated with tungsten.

The movable body 108 may be a microstructure, having dimensions on the order of microns, tens of microns, or hundreds or microns. The dimensions, however, are not limiting.

As shown in FIG. 1, the movable body 108 is suspended above the substrate 101 by an anchor 102. The anchor 102 may be formed of any suitable material and have any suitable dimensions. In some embodiments, the anchor 102 is formed of a dielectric material deposited on the substrate 101 and suitably patterned to define a desired shape. In some embodiments, the anchor 102 may be formed of the same material as the substrate 101. The anchor may have a length between the substrate 101 and the beam 108 on the order of microns or tens of microns, as non-limiting examples.

The movable body 108 may be coupled to the anchor 102 in any suitable manner. For example, the movable body 108 may be coupled to the anchor by one or more tethers or springs, allowing the movable body 108 to move relative to the anchor 102 in-plane and/or out-of-plane, as will be described further below.

As shown, the MEMS sensor 100 may include sidewalls 106a and 106b, thus defining a cavity or well 107 in which the movable body 108 is disposed. The sidewalls 106a and 106b may be formed of any suitable material. In some embodiments, the sidewalls 106a and 106b are formed of a material different than the substrate 101. For example, a layer of material may be formed on the substrate 101 and patterned to form the sidewalls 106a and 106b. In alternative embodiments, the sidewalls 106a and 106b may be formed of the substrate material 101. The substrate may be etched to define cavity 107, thus creating sidewalls 106a and 106b. The substrate 101, including the sidewalls 106a and 106b, when included, may also be silicon coated with tungsten.

As illustrated in FIG. 1, the MEMS structure may form capacitors C1-C4 which may be used for capacitive sensing. For example, the capacitors C1 and C2 may sense movement of the movable body 108 toward and away from the substrate 101. The capacitors C3 and C4 may sense movement of the movable body 108 toward and away from the sidewalls 106a and 106b. The movable body 108, sidewalls 106a and 106b, and substrate 101 may include suitable structures for forming the capacitors, such as doped regions, electrodes, or other suitable structures. As an example, the substrate 101 and sidewalls 106a and 106b may be formed of silicon, doped suitably to be conductive in areas opposite the adjacent surfaces of the movable body 108. Suitable circuitry may also be provided, on the substrate 101 or off-chip, to monitor the capacitances C1-C4. The MEMS sensor 100 may additionally include a voltage source configured to bias opposing surfaces of the sensor appropriately to detect changes in capacitances C1, C2, C3, and/or C4. For example, the movable body 108 may be biased at a first voltage while the substrate 101 and sidewalls 106a and 106b may be biased at a second voltage (e.g., ground potential). In the absence of conductive material 110, the biasing may tend to generate surface charges on the opposing surfaces of the movable body and substrate 101. Such surface charge accumulation may be mitigated by the conductive material 110. That is, the conductive material 110 on the non-contacting opposing surfaces of the substrate and the movable body may reduce or eliminate entirely surface charge on those surfaces. Thus, the detected capacitances C1, C2, C3, and/or C4 may not be the result of surface charge build-up, and thus may more accurately represent operation of the movable body.

It should be appreciated from the foregoing description of FIG. 1 that the capacitances illustrated may be said to be formed by non-contacting, opposing capacitor plates. For example, the movable body may be considered a first capacitor plate and the substrate a second capacitor plate. The sidewalls 106a and 106b may be considered capacitor plates. Alternative terminology may be used.

While FIG. 1 illustrates one example of a capacitive MEMS sensor, it should be appreciated that capacitive MEMS sensors may take various other forms, and the aspects of the present application are not limited to the specific construction of FIG. 1.

Figure 2:
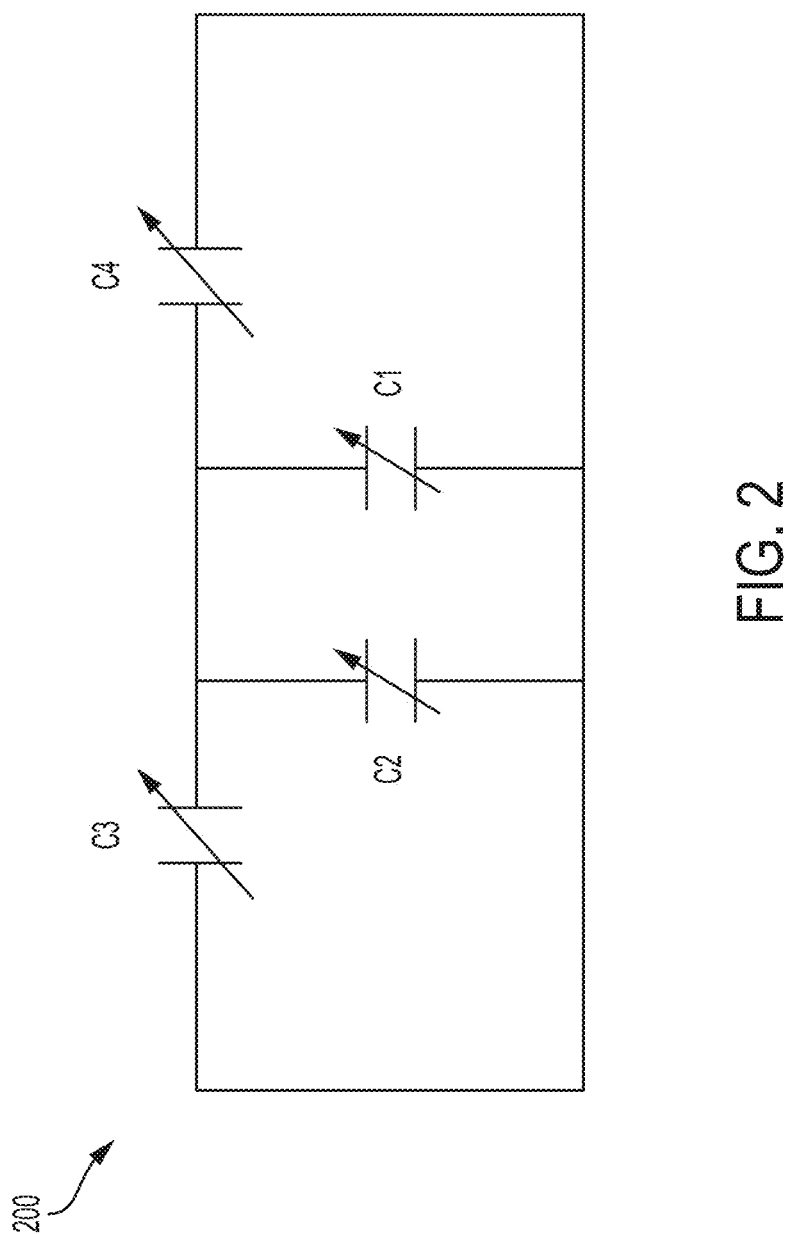
FIG. 2 illustrates an equivalent circuit for the MEMS sensor of FIG. 1, according to a non-limiting embodiment.

FIG. 2 shows an equivalent circuit of the capacitive MEMS sensor of FIG. 1, according to a non-limiting embodiment of the present application. Capacitors C1-C4 may be variable capacitors, with their capacitances depending on the distance between the movable body 108 and the opposing capacitor plate (e.g., the substrate 101 or sidewalls 106a and 106b). In one embodiment, associated circuitry may be provided to measure the capacitances and detect changes in the capacitance value to assess a sensed condition.

According to an aspect of the present application, a method of fabricating a capacitive MEMS sensor with conductively coated, non-contacting, opposing surfaces may be provided. For example, a method of fabricating the MEMS sensor 100 of FIG. 1 is provided. The method may include fabricating a movable body, such as a proof mass or beam, by releasing the movable body from a surrounding substrate such that the movable body is suspended above the substrate. In at least some embodiments, the movable body is formed of silicon, for example by releasing the movable body from an underlying silicon substrate. The movable body may be defined such that is has at least one surface opposing a surface of the substrate or a sidewall, thus forming a capacitance between the two. The opposing surfaces defining capacitances may then be selectively coated with tungsten, for example through a reduction process. The coating may increase the conductivity of the coated surfaces, thus removing, eliminating, and preventing surface charge. The coating may also increase the mass of the movable body, thus increasing sensitivity of the MEMS sensor. Performing the coating after the MEMS features are released may provide a more uniform coating and avoid problems associated with stress from uneven coating. Also, it may allow for encapsulation of the relevant MEMS structures, which may not be achieved if attempting to coat prior to release.

In those embodiments in which a selective coating is formed on surfaces of a movable body and/or opposing capacitive plates, the coating may be formed through a selective chemical vapor deposition (CVD) process. Such a process may selectively coat silicon surfaces of the MEMS sensor, without undesirably coating dielectrics. A non-limiting example is now described.

According to some non-limiting embodiments, selective conductive coatings (e.g., tungsten) are formed on opposing surfaces of capacitive structures of a capacitive MEMS sensor using tungsten CVD. For example, the capacitive structures to be coated may be formed of silicon, and the coating may be formed by forming (e.g., depositing) tungsten on silicon surfaces with $WF_6$. This may be accomplished through a two-step process in some non-limiting embodiments. The first step forms a seed layer on the silicon surfaces to be coated. Formation of the seed layer may be accomplished in various manners. According to one method, one of the following reactions is performed, which results in consuming silicon from the exposed silicon surfaces of the movable body, substrate, or other structure to be coated:

$3Si+2WF_6 \rightarrow 2W(s)+3SiF_4$ or

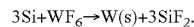
$3Si+WF_6 \rightarrow W(s)+3SiF_2$.

Which of the two foregoing reactions occurs depends on operating conditions. However, either is suitable. Because these reactions involve consuming silicon, the reactions are self-limiting.

An alternative manner for forming the seed layer, which is less selective in terms of deposition location than the two processes listed above, is to use $SiH_4$. Under this approach, the reaction may proceed as follows:

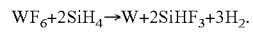
$WF_6+2SiH_4 \rightarrow W+2SiHF_3+3H_2$.

A further alternative for forming the seed layer is to use $H_2$, in which case the reaction may proceed as follows:

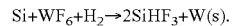
$Si+WF_6+H_2 \rightarrow 2SiHF_3+W(s)$.

In some embodiments, formation of this first layer of tungsten according to any of the foregoing reactions may be sufficient, and no further steps for forming a thicker layer of tungsten are implemented. However, in some embodiments the thickness of the tungsten layer resulting from the foregoing processes may be less than desirable, and thus an optional second step of the two-step process may be performed to increase the thickness of the tungsten layer. In such situations, the tungsten layer formed according to the foregoing reactions may be considered a seed layer and the subsequent step may involve growing additional tungsten on the seed layer. In those embodiments in which the second step is used, it may proceed according to the reaction:

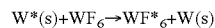
$W^*(s)+WF_6 \rightarrow WF^*_6+W(s)$ and

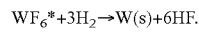
$WF_6^*+3H_2 \rightarrow W(s)+6HF$.

In the reactions above, the "*" represents the reaction site at which the reaction occurs.

The formation of the tungsten film or layer may be controlled to be reaction limited, thus providing uniform coverage on the movable mass or other component being coated. In this manner, selective coverage of silicon surfaces may be achieved. Surfaces covered with oxide (e.g., insulating layers separating conductive traces on the substrate) may not be coated.

The coating process may be performed at low temperatures. For example, the process may be performed at 300° C.-500° C., or any value or range of values within that range.

As described previously, coating a silicon MEMS component, such as a movable body, with tungsten may increase the sensor mass. At least some types of MEMS sensors, such as accelerometers and gyroscopes, may benefit from increased mass. Thus, the selective coating as described herein may additionally benefit the operation of such sensors in this manner, in addition to avoiding problems with surface charge build-up. Moreover, using a selective coating as described herein may still allow precise control over critical dimensions of the structure through silicon micromachining techniques since the majority of the coated structure is formed of silicon in some embodiments.

Figure 3:
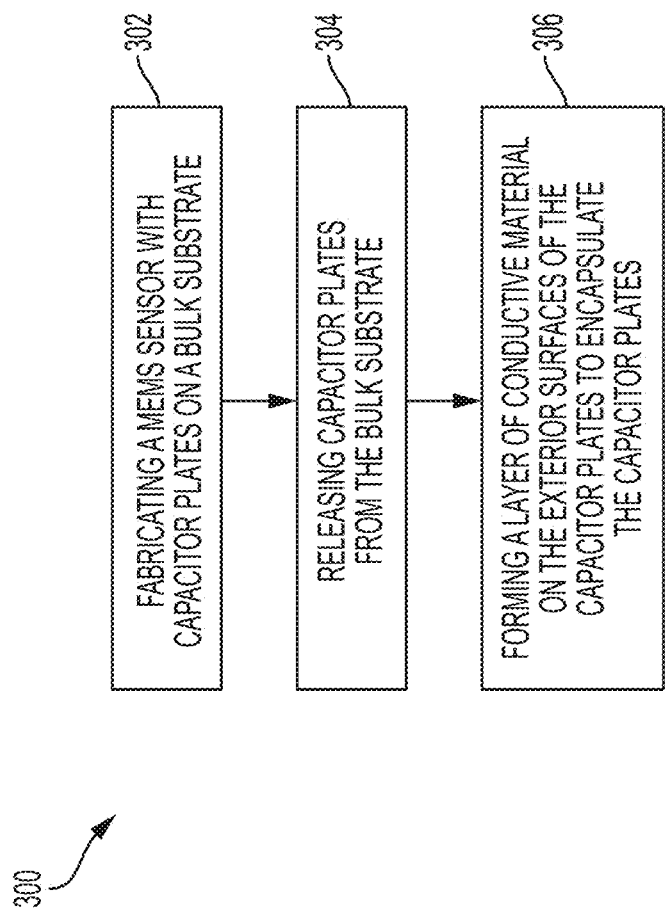
FIG. 3 is a process flow sequence for fabrication of the MEMS sensor of FIG. 1.

FIG. 3 shows a process flow sequence for fabrication of the capacitive MEMS sensor consistent with the coating process just described. According to this non-limiting embodiment, the method 300 begins at stage 302 by fabricating a MEMS sensor with capacitor plates on a bulk substrate, although other types of substrates may be used. Fabricating the MEMS sensor with capacitor plates may involve various steps depending on the nature of the MEMs sensor. For example, a well may be defined in the substrate, an anchor defined for supporting a movable body, and a movable body of any suitable type may be defined. Formation of the MEMS sensor may also involve defining capacitor plates on a substrate and/or sidewalls, among other possible locations. For example, doped silicon regions or other conductive areas may be defined.

In some embodiments, formation of one or more of the MEMS structures, such as the capacitor plates to be used for defining sensing capacitances, may involve the formation of a sacrificial layer. The sacrificial layer may be formed of any suitable material and have any suitable thickness.

At stage 304 of the method 300, one or more of the capacitor plates (e.g., on the movable body or otherwise) may be released from the bulk substrate. The release process may comprise selectively etching the sacrificial layers using a dry or wet etching technique that does not affect the bulk substrate or capacitor plates. The release process may expose exterior surfaces of the one or more capacitor plates. For example, the surfaces of a silicon movable body may be exposed by the release step.

The method 300 may proceed with stage 306, namely forming a layer of conductive material on the exterior surfaces of the capacitor plates to encapsulate the capacitor plates. The formation of the conductive material may proceed in the manner previously described herein. For example, a two-step process of forming a seed layer, followed by growth of the conductive layer from the seed layer may be used. Thus, in at least some embodiments, the conductive layer is formed using a surface selective deposition as described previously. For example, the surface selective deposition may be a CVD process comprising silicon reduction with $WF_6$, which may selectively deposit on silicon, although other depositions are possible. In one embodiment, non-silicon surfaces of the capacitive MEMS sensor are not encapsulated in the conductive layer. According to some embodiments, a bulk substrate that is distinct from the capacitive plates may not be encapsulated, while the attached capacitive plates would be encapsulated. In other embodiments, the anchor or attachment features are not encapsulated.

In one embodiment, the conductive layer comprises a tungsten layer. In other embodiments, multiple conductive layers are formed, which may all comprise the same material or different materials. Other conductive materials, such as iridium, chromium, platinum, or conductive alloys, may be used.

FIGS. 4A-4E illustrate a non-limiting fabrication sequence for a capacitive MEMS sensor consistent with the method 300 of FIG. 3, thus resulting in a MEMS sensor with opposing capacitive surfaces selectively coated (e.g., encapsulated in) a conductive material. FIG. 4A shows a bulk substrate 101 that has been fabricated with sidewalls 106a, 106b. In one embodiment, the sidewalls 106a, 106b are capacitive plates that are formed of the same material as the bulk substrate 101, although they may be formed of different materials in other embodiments. In one embodiment, the sidewalls 106a, 106b are monolithic with the bulk substrate 101 and the space between the sidewalls 106a, 106b is formed by etching. In another embodiment, the sidewalls 106a, 106b are fixed to the bulk substrate 101 through bonding, adhesion, or another suitable attachment mechanism.

In the embodiment shown, an anchor 112 has been positioned on the bulk substrate 101 in between the sidewalls 106a, 106b. The anchor 112 may extend above the sidewalls, may have the same height as the sidewalls, or may be shorter than the sidewalls. In some embodiments, the sidewalls have the same dimensions or different dimensions.

FIG. 4B shows the bulk substrate 101 with a sacrificial layer 114 in the space between the sidewalls 106a, 106b. The sacrificial layer 114 may be deposited or grown using techniques such as oxidation. In one embodiment, the sacrificial layer 114 extends to the top of the anchor 112, such that the sacrificial layer 114 provides support for the fabrication of a beam 108, shown in FIG. 4C. The fabrication of the movable body 108 may involve a deposition process and suitable patterning, wherein the deposited material conforms to the surface of the sacrificial layer 114. In one embodiment, the resulting movable body 108 may be parallel with the bulk substrate 101.

FIG. 4D illustrates the capacitive MEMS sensor after releasing the movable body 108 from the bulk substrate 101. The release may be achieved by selectively etching the sacrificial layer between the bulk substrate 101 and the movable body 108. In this embodiment, releasing the movable body 108 allows the movable body 108 to rotate about the point of connection to the anchor 112 in a direction toward and away from the substrate 101.

FIG. 4E illustrates the capacitive MEMS sensor after encapsulation with a conductive coating of conductive material 110. In this embodiment, the bulk substrate 101, the sidewalls 106a, 106b, and the movable body 108 are silicon. Some of the surfaces have a dielectric material 402 formed thereon, as shown in cross-hatching. For example, regions of dielectric material 402 may be formed to electrically isolate signal lines or other structures of the sensor. A silicon reduction with tungsten hexafluoride may selectively encapsulate the exposed silicon surfaces in tungsten, leaving the dielectric material 402 uncovered. Thus, as shown, the tungsten may cover the underside, topside, and ends of the movable body 108. In other embodiments, only the capacitive members may be encapsulated in tungsten or another suitable conductive material. For example, only the movable body 108 and the sidewalls 106a and 106b may be encapsulated.

While FIGS. 1 and 4A-4E have illustrated non-limiting examples of a capacitive MEMS sensor which may utilize selective conductive coating of capacitive structures, alternative configurations are possible. Further non-limiting examples are illustrated in FIGS. 5A-5B.

Figure 5B:
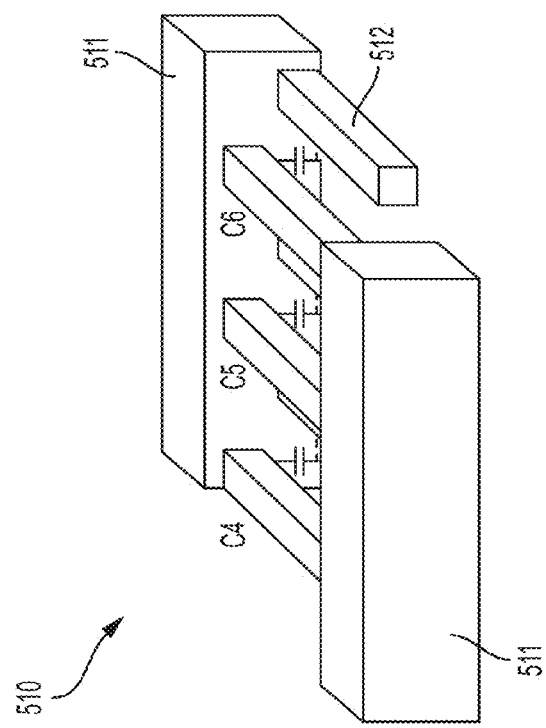
FIGS. 5A-5B illustrate alternative non-limiting embodiments of a MEMS sensor having sense fingers coated with a conductive material.
Figure 5A:
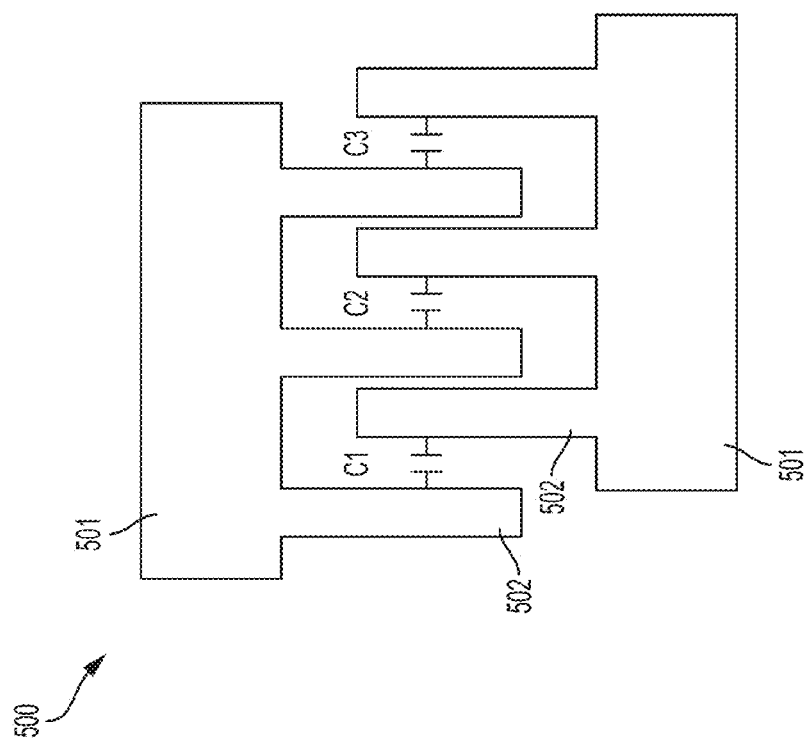

Referring to FIG. 5A, a capacitive MEMS structure 500 is shown including a substrate 501 having interdigitated sense fingers 502. The sense fingers 502 may be in the same plane as each other—in the plane of the page in this non-limiting example—and may define between them the illustrated capacitances C1-C3. The sense fingers 502 may move, for example in response to acceleration, thus changing the distance between them and therefore altering one or more of the capacitances C1-C3.

According to a non-limiting embodiment, the sense fingers 502 are formed of a material having a native oxide, and are coated (e.g., encapsulated) in a conductive material, such as a metal. For example, the sense fingers 502 are formed of silicon encapsulated by tungsten in a non-limiting embodiments. The illustrated structure may be formed by releasing the silicon fingers from the substrate 502 and then encapsulating them in tungsten using any of the selective tungsten deposition techniques described herein.

FIG. 5B illustrates a variation of the MEMS structure 500 of FIG. 5A. The MEMS structure 510 includes a substrate 511 and sense fingers 512 forming capacitances C4-C6. The sense fingers maybe separated from each other vertically rather than the in-plane configuration of FIG. 5A. Still, the sense fingers 512 may be silicon fingers encapsulated by tungsten in some embodiments.

The use of selective coatings as described herein may find application in various MEMS devices. As described, MEMS capacitive sensors, such as inertial sensors (e.g., gyroscopes and accelerometers) may benefit from the selective coatings described herein. Other types of capacitive MEMS devices may also implement the selective coatings.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) sensor, comprising:
    a first capacitor plate with a top, bottom, and side surface all covered with a metal, the first capacitor plate comprising a semiconductor material;
    a second capacitor plate in-plane with the first capacitor plate in a first plane, spaced apart from the first capacitor plate, and covered with the metal; and
    a third capacitor plate covered with the metal and spaced apart from the first capacitor plate in a second plane different from the first plane.

2. The MEMS sensor of claim 1, wherein the first capacitor plate is on or part of a movable mass.

3. The MEMS sensor of claim 2, wherein the second and third capacitor plates are on or part of a substrate.

4. The MEMS sensor of claim 1, wherein the first capacitor plate is part of a movable mass and is encapsulated by the metal.

5. The MEMS sensor of claim 1, wherein the second and third capacitor plates are on or part of a substrate.

6. The MEMS sensor of claim 1, wherein the metal is tungsten.

7. A microelectromechanical systems (MEMS) device, comprising:
    a movable mass having a first electrode formed of a semiconductor material with a top, bottom, and side surface all covered by a metal; and
    a second electrode spaced apart from and facing the side surface of the first electrode, the second electrode being covered by the metal.

8. The MEMS device of claim 7, wherein the second electrode is on or part of a substrate above which the movable mass is suspended.

9. The MEMS device of claim 8, wherein the first electrode is formed of silicon and the metal is tungsten.

10. The MEMS device of claim 7, further comprising a third electrode spaced from and facing the bottom surface of the movable mass, the third electrode being covered by the metal.

11. The MEMS device of claim 10, wherein the first electrode, second electrode, and third electrode are formed of silicon, and the metal is tungsten.

12. A microelectromechanical systems (MEMS) device, comprising:
    a movable mass having a first electrode formed of a semiconductor material with a top, bottom, and side surface each having a conductive coating disposed thereon; and
    a second electrode spaced apart from and facing the side surface of the first electrode, the second electrode having the conductive coating disposed thereon.

13. The MEMS device of claim 12, wherein the second electrode is on or part of a substrate above which the movable mass is suspended.

14. The MEMS device of claim 13, wherein the first electrode is formed of silicon and the conductive coating comprises a metal.

15. The MEMS device of claim 14, wherein the metal is tungsten.

16. The MEMS device of claim 12, further comprising a third electrode spaced from and facing the bottom surface of the movable mass, the third electrode having a conductive coating disposed thereon.

17. The MEMS device of claim 16, wherein the first electrode, second electrode, and third electrode are formed of silicon, and the conductive coating comprises a metal.

18. The MEMS device of claim 17, wherein the metal is tungsten.

19. The MEMS device of claim 12, wherein the top, bottom, and side surface of the first electrode all are encapsulated by the conductive coating.

20. The MEMS device of claim 19, wherein the conductive coating comprises tungsten.

* * * * *